(12) United States Patent
Lan et al.

(10) Patent No.: US 11,462,796 B2
(45) Date of Patent: Oct. 4, 2022

(54) TRACKER

(71) Applicant: Systems & Technology Corp., New Taipei (TW)

(72) Inventors: Ming-Chuan Lan, New Taipei (TW); Chang-Jung Lee, New Taipei (TW); Ming-Chuan Wu, New Taipei (TW)

(73) Assignee: SYSTEMS & TECHNOLOGY CORP., New Taipei (TW)

( * ) Notice: Subject to any disclaimer, the term of this patent is extended or adjusted under 35 U.S.C. 154(b) by 280 days.

(21) Appl. No.: 16/888,881

(22) Filed: Jun. 1, 2020

(65) Prior Publication Data
US 2021/0184186 A1    Jun. 17, 2021

(30) Foreign Application Priority Data
Dec. 13, 2019   (TW) ................. 108216560

(51) Int. Cl.
| | |
|---|---|
| *H05K 5/00* | (2006.01) |
| *H05K 5/02* | (2006.01) |
| *H01M 50/20* | (2021.01) |
| *H04W 4/029* | (2018.01) |
| *G01S 7/03* | (2006.01) |

(52) U.S. Cl.
CPC .............. *H01M 50/20* (2021.01); *G01S 7/03* (2013.01); *H04W 4/029* (2018.02); *H05K 5/0086* (2013.01); *H05K 5/0091* (2013.01); *H05K 5/0208* (2013.01)

(58) Field of Classification Search
CPC ......................................................... G06F 1/16
See application file for complete search history.

(56) References Cited

U.S. PATENT DOCUMENTS

| | | | | |
|---|---|---|---|---|
| 5,909,357 A | * | 6/1999 | Orr ........................... | G06F 1/16 361/679.6 |
| 2019/0372069 A1 | * | 12/2019 | Lee ....................... | H01M 50/50 |

* cited by examiner

*Primary Examiner* — Jerry Wu
(74) *Attorney, Agent, or Firm* — Bacon & Thomas, PLLC

(57) ABSTRACT

A tracker includes a tracking device and a battery device. The tracking device has recesses, fixing holes and conductive points. The battery device has a receiving portion and a body portion integrally coupled to the receiving portion. The receiving portion is provided with a receiving groove and has protrusions, through holes and conductive terminals. The body portion has recesses, fixing holes and conductive points. The tracking device is received in the receiving groove. The recesses, fixing holes and conductive points of the tracking device are respectively corresponding to the protrusions, through holes and conductive terminals of the battery device. The shape of the body portion is the same as that of the tracking device, and the recesses, fixing holes and conductive points of the body portion are disposed at the same position as the tracking device.

6 Claims, 5 Drawing Sheets

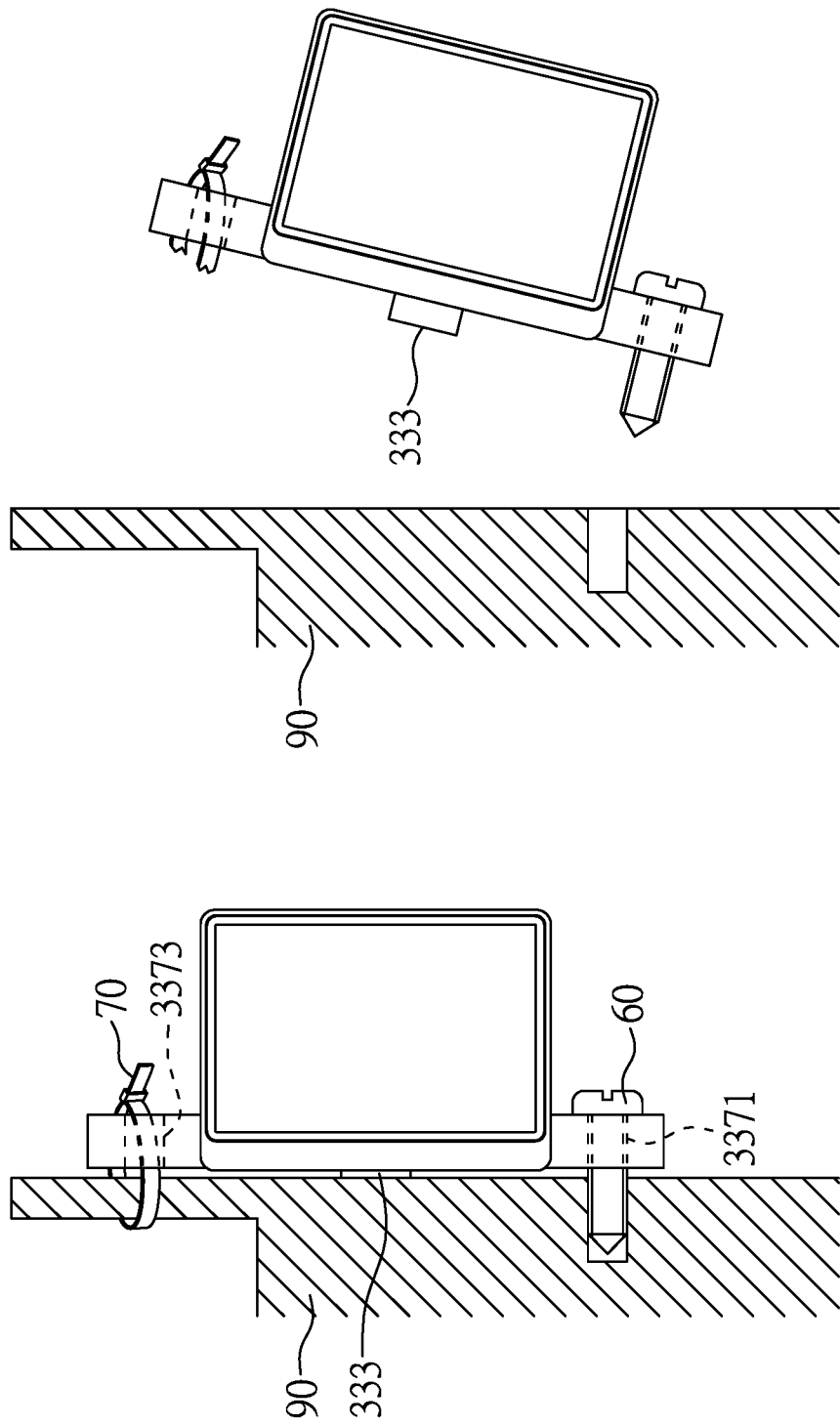

TRACKER

BACKGROUND

1. Field of the Disclosure

The disclosure relates to a tracker and, more particularly, to a tracker with removal prevention and capable of cascading a plurality of batteries.

2. Description of Related Art

In order to ensure the safety of an object in use or during transportation, a tracker is generally installed on the object and, by monitoring the wireless signals sent by the tracker at a remote site, it is able to be aware of the current location of the object so as to determine whether the object is used or transported normally.

However, the prior tracker is easily separated from the object unintentionally or maliciously, and the use period of the tracker varies depending on its application; for example, it may be only several days or up to several years. Because the power supplied to the tracker has to last for the entire period of monitoring, the power supply of the prior tracker often does not meet the actual needs.

Therefore, it is desirable to provide an improved tracker to mitigate and/or obviate the aforementioned problems.

SUMMARY

The disclosure provides a tracker which not only is provided with removal prevention but also is capable of cascading a plurality of batteries for supplying appropriate and sufficient electric power.

To achieve the object, there is provided a tracker, which includes: a tracking device including a top surface defined therein at least one recess, and a bottom surface defined therein at least one fixing hole; a battery device including a receiving portion provided with a top plate, a bottom plate and a receiving groove disposed between the top plate and the bottom plate, and a body portion integrated with the receiving portion and provided with a top surface defined therein at least one recess and a bottom surface defined therein at least one fixing hole, wherein the top plate has at least one protrusion facing the receiving groove, and at least one through hole penetrates the bottom plate to be in communication with the receiving groove, wherein the recess and fixing hole of the tracking device respectively correspond to the protrusion and through hole of the battery device when the receiving groove receives the tracking device, and the body portion and the tracking device have the same shape while positions of the recess and the receiving groove of the body portion are the same as those of the tracking device.

Other objects, advantages, and novel features of the disclosure will become more apparent from the following detailed description when taken in conjunction with the accompanying drawings.

BRIEF DESCRIPTION OF THE DRAWINGS

FIG. 5 shows the tracker fixed to an object.
FIG. 6 shows the tracker separated from an object.

DETAILED DESCRIPTION

Figure 1:
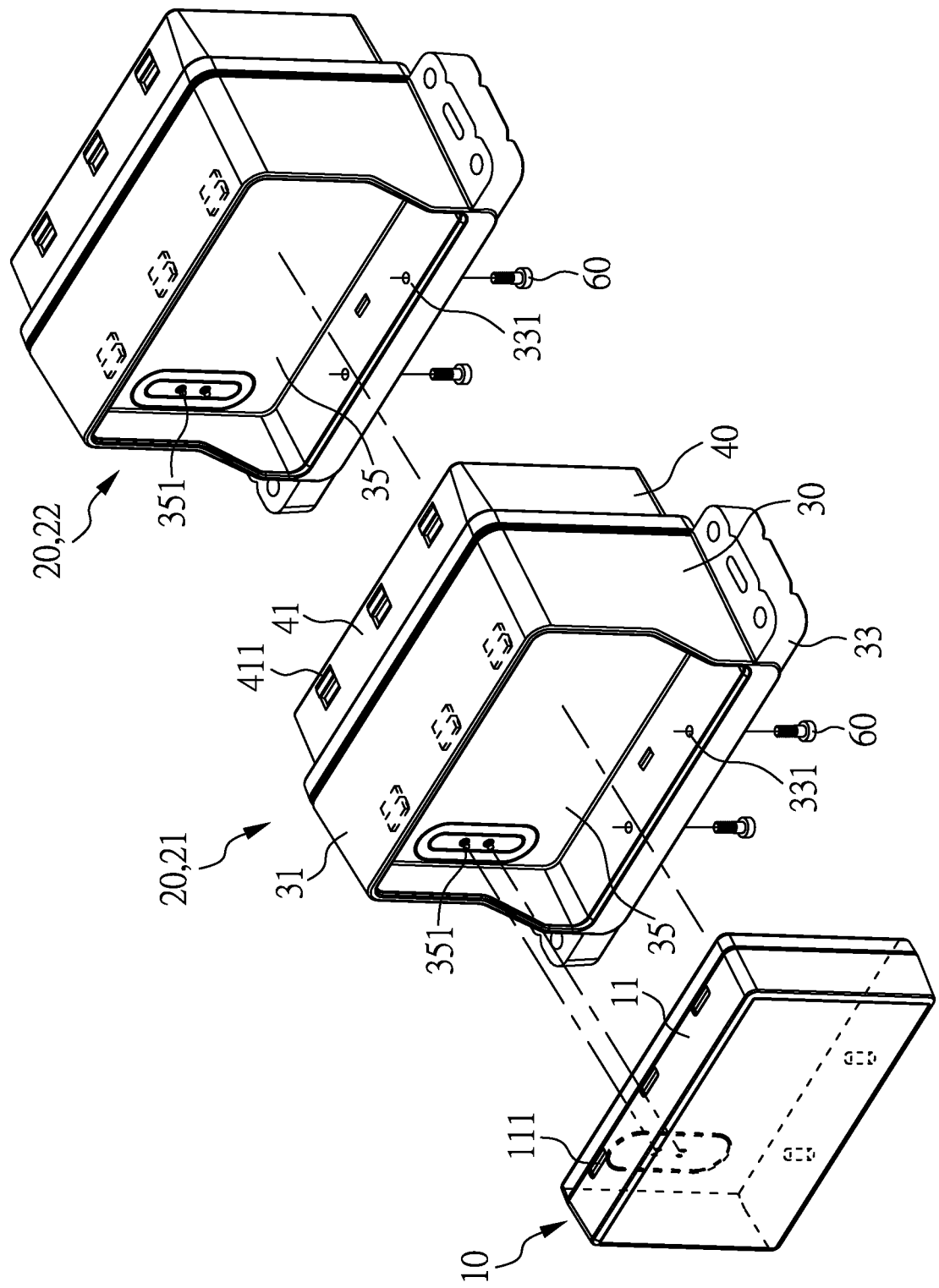
FIG. 1 shows a perspective view of the tracker.

FIG. 1 shows a perspective view of the tracker, which includes a tracking device 10 and at least one battery device 20. For convenience of description, at least one battery device 20 is shown as a first battery device 21 and a second battery device 22. The tracking device 10 may be combined with the first battery device 21 from which power is supplied to the tracking device 10 for operation, and may be further combined with the second battery device 22 so that power is supplied to the tracking device for operation from the first and second battery devices 21, 22. As a result, based on the actual requirement, an appropriate number of battery devices 20 can be combined to provide the tracking device 10 with appropriate and sufficient electric power.

Figure 2:
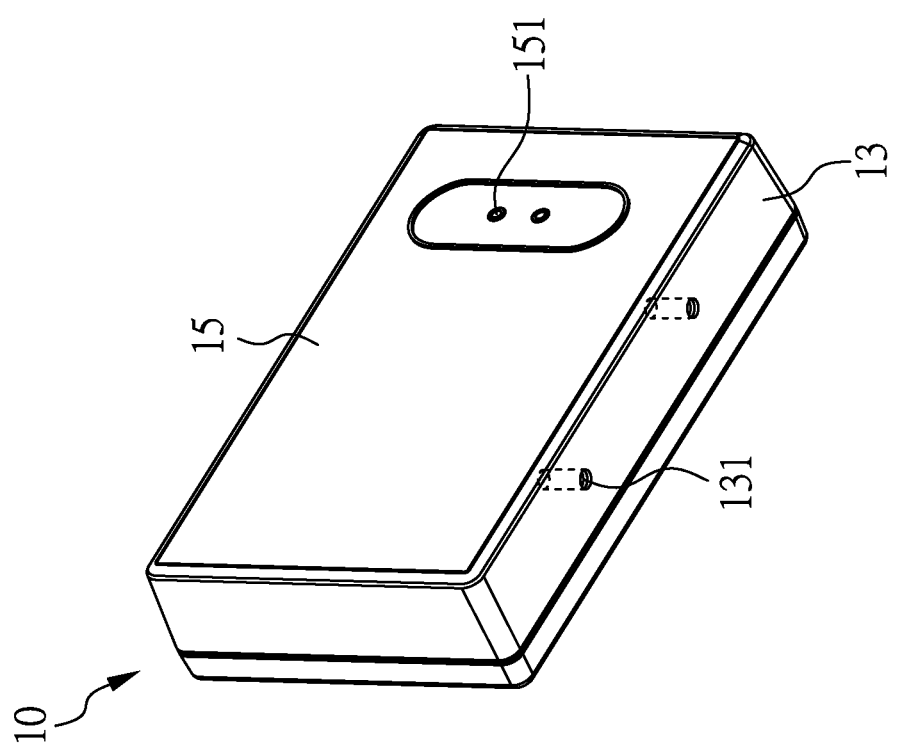
FIG. 2 shows a back-bottom view of the tracking device.

As shown in FIG. 1 and FIG. 2, the tracking device 10 includes a top surface 11, a bottom surface 13 and a side surface 15, wherein at least one recess 111 is defined in the top surface 11, at least one fixing hole 13 is defined in the bottom surface 13, and a plurality of conductive contacts 151 are formed on the side surface 15. In this embodiment, there are three grooves 111, two fixing holes 131, and two conductive points 151 respectively corresponding to anode and cathode of battery.

Figure 3:
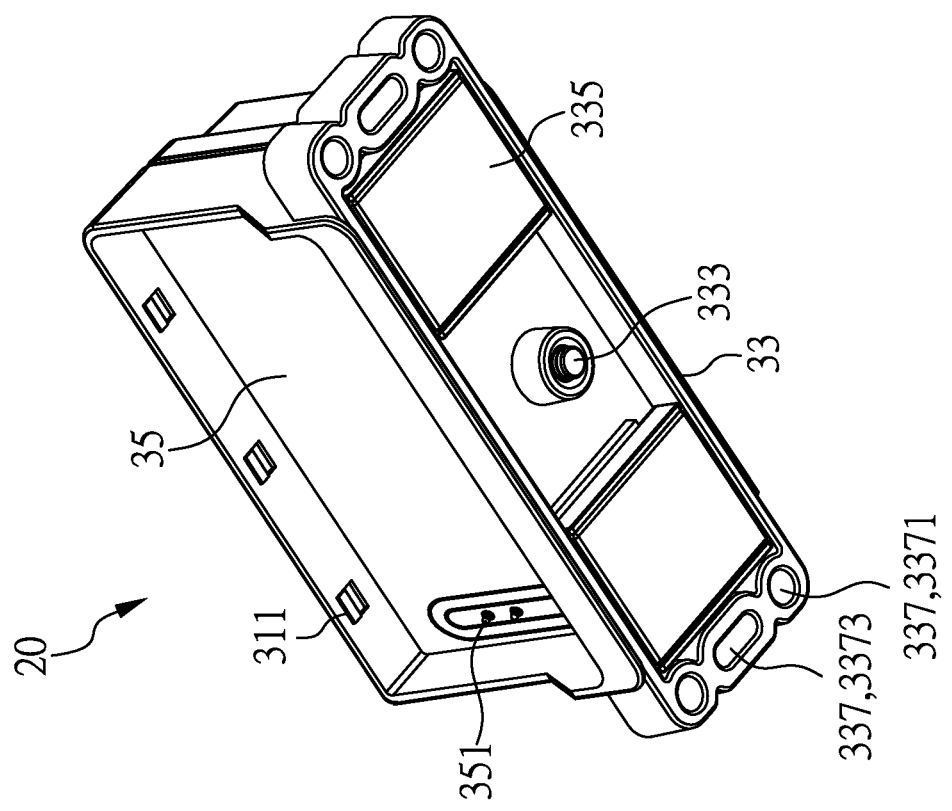
FIG. 3 and FIG. 4 respectively show a front-bottom view and a back-bottom view of the battery device.
Figure 4:
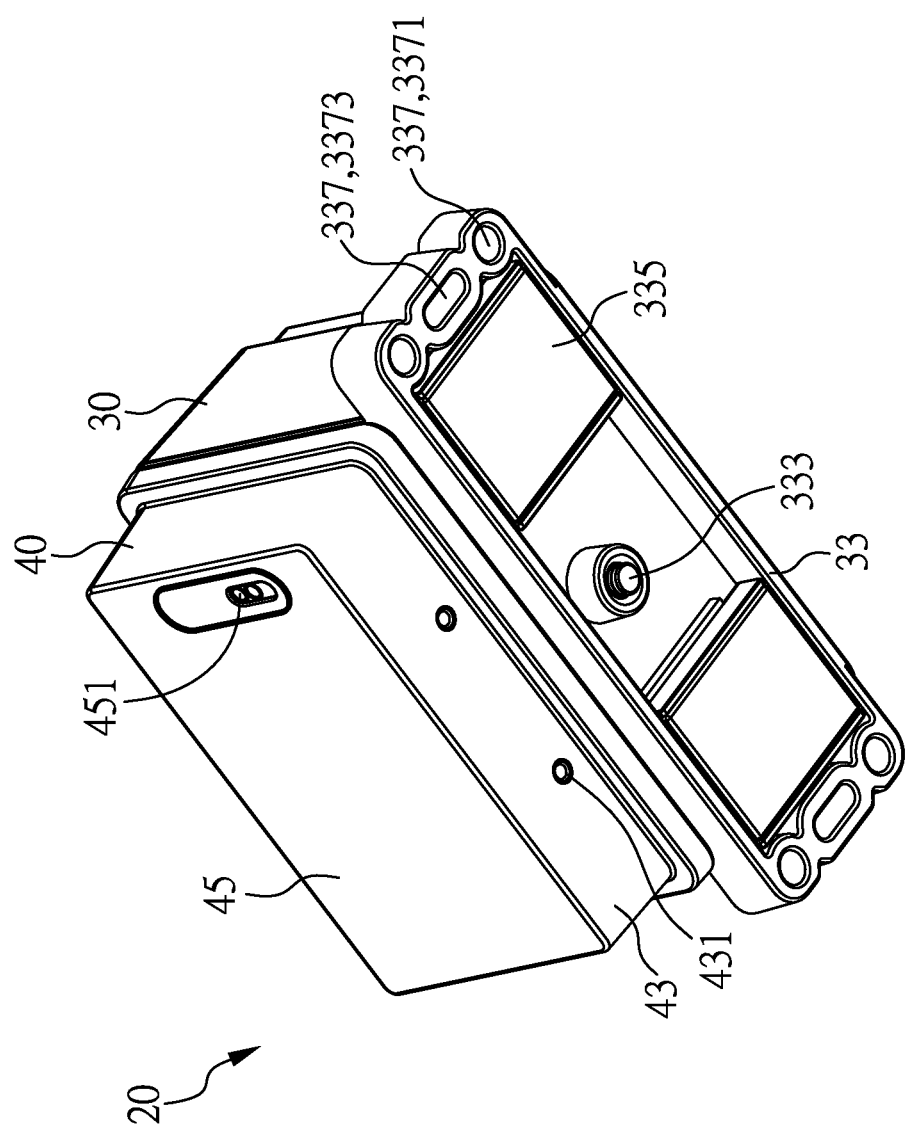

With reference to FIG. 1 and FIGS. 3 and 4, the battery device 20 includes a receiving portion 30, and a body portion integrated with the receiving portion 30. The receiving portion 30 has a top plate 31, a bottom plate 33, and a receiving groove 35 disposed between the top plate 31 and the bottom plate 33. The top plate 31 has at least one protrusion 311 facing the receiving groove 35. At least one through hole 331 penetrates the bottom plate 33 and is in communication with the receiving groove 35, and a plurality of conductive terminals 351 are disposed in the receiving groove 35. In this embodiment, there are three protrusions 311, two through holes 331, and two conductive terminals 351 respectively corresponding to anode and cathode of battery. The body portion 40 has a top surface 41, a bottom surface 43 and a side surface 45, wherein at least one groove 411 is defined in the top surface 41, at least one fixing hole 431 is defined in the bottom surface 43, and a plurality of conductive points 451 are formed on the side surface 45. In this embodiment, there are three grooves 411, two fixing holes 431, and two conductive points 451 respectively corresponding to anode and cathode of battery.

The receiving portion 30 is configured in such a manner that, when the tracking device 10 is received in the receiving groove 35 to be combined with the battery device 20, the grooves 111, the fixing holes 131 and the conductive points 151 of the tracking device 10 correspond to the protrusions 311, the through holes 331 and the conductive terminals 351 of the battery device 20, respectively. Therefore, the grooves 111 of the tracking device 10 engage the protrusions 311, and the fixing holes 131 of the tracking device 10 are aligned with the through holes 331 so as to use screws 60 (see FIG. 1) to lock the tracking device 10 and the battery device 20. The conductive points 151 of the tracking device 10 respectively contact the conductive terminals 351 so that the power of the battery device 20 can be supplied to the tracking device 10.

The body portion 40 is configured to have the same shape as the tracking device 10, and the grooves 411, fixing holes 431 and conductive points 451 of the body portion 40 are disposed at the same positions as the grooves 111, fixing holes 131 and conductive points 151 of the tracking device 10. Therefore, the body portion 40 of the battery device 20 (such as the first battery device 21) may be received in the receiving groove 35 of another battery device 20 (such as the second battery device 22), and more battery devices 20 can be combined in a similar manner. When the body portion 40 of the first battery device 21 is received in the receiving groove 35 of the second battery device 22, the recesses 411 of the body portion 40 engage the protrusions 311 of the second battery device 22. The fixing holes 431 of the body portion 40 are aligned with the through holes 331 of the second battery device 22 so as to use screws 60 (see FIG. 1) to lock the first battery device 21 and the second battery device 22. The conductive points 451 of the body portion 40 of the first battery device 21 respectively contact the conductive terminals 351 of the second battery device 22 so that the first battery device 21 and the second battery device 22 are connected in parallel to supply power to the tracking device 10.

Furthermore, please refer to FIG. 3 and FIG. 4, wherein the bottom plate 33 of the battery device 20 is installed with a removal-prevention switch 333 and at least one magnet 335, and each of the two ends of the bottom plate 33 is provided with at least one bonding hole 337. In this embodiment, the removal-prevention switch 333 is a pushbutton switch disposed in the center of the bottom plate 33, the at least one magnet 335 includes two strong magnets respectively disposed on two sides of the removal-prevention switch 333, and the at least one bonding hole 337 includes two screw holes 3371 and a tying hole 3373. Accordingly, as shown in FIG. 5, the tracker is fixed to an object 90 by the magnetic force of the magnet 335 and, furthermore, screws 60 may be used to lock the tracker to the object 90 via the screw holes 3371, and ribbon ties 70 may be used to tie the tracker to the object 90 via the tying holes 3373. Since the tracker is closely attached to the object 90, the removal-prevention switch 333 is tightly pressed to turn off the alarm. On the other hand, as shown in FIG. 6, when the tracker is separated from the object 90, the removal-prevention switch 333 is released to thus turn on the alarm, so as to notify a remote control center of such a separation state thereby achieving the effect of removal prevention. In addition, the removal-prevention switch 333 may also be a photo-sensing electronic switch, a reed switch or any switch capable of detecting a separation.

The aforementioned embodiments are examples only for convenience of description, the scope of the present disclosure is claimed hereinafter in the claims and is not limited to the embodiments.

What is claimed is:

1. A tracker comprising: a tracking device including a top surface defined therein at least one recess, and a bottom surface defined therein at least one fixing hole; and a battery device including a receiving portion provided with a top plate, a bottom plate and a receiving groove disposed between the top plate and the bottom plate, and a body portion integrated with the receiving portion and provided with a top surface defined therein at least one recess and a bottom surface defined therein at least one fixing hole, wherein the top plate has at least one protrusion facing the receiving groove, and at least one through hole penetrates the bottom plate to be in communication with the receiving groove, wherein the recess and fixing hole of the tracking device respectively correspond to the protrusion and through hole of the battery device when the receiving groove receives the tracking device, the body portion and the tracking device have the same shape, and positions of the recess and the receiving groove of the body portion are the same as those of the tracking device; and the tracking device has a side surface formed thereon a plurality of conductive points, the battery device has a plurality of conductive terminals disposed in the receiving groove and a plurality of conductive points disposed on a side surface of the body portion, the conductive points of the tracking device correspond to the conductive terminals of the battery device, and positions of the conductive 7 points of the body portion are the same as those of the tracking device; and the body portion of the battery device is received in a receiving groove of another battery device, the recess of the body portion engages the protrusion of the another battery device, and the fixing hole of the body portion is aligned with the through hole of the another battery device so as to lock the battery 8 device and the another battery device by a screw, while the conductive points of the body portion respectively contact the conductive terminals of the another batter device.

2. The tracker as claimed in claim 1, wherein the bottom plate is installed with a removal-prevention switch for turning off alarm when the tracker is fixed to an object with the bottom plate, and turning on alarm when the tracker is separated from the object.

3. The tracker as claimed in claim 2, wherein the removal-prevention switch is a pushbutton switch, a photo-sensing electronic switch or a reed switch.

4. The tracker as claimed in claim 2, wherein the bottom plate is installed with at least one magnet for fixing the tracker to an object.

5. The tracker as claimed in claim 2, wherein the bottom plate has two end portions and each end portion is provided with at least one bonding hole for fixing the tracker to an object.

6. The tracker as claimed in claim 1, wherein, when the receiving groove receives the tracking device, the recess of the tracking device engages the protrusion, and the fixing hole of the tracking device is aligned with the through hole so as to lock the tracking device and the battery device by a screw, while the conductive points of the tracking device respectively contact the conductive terminals.

\* \* \* \* \*